United States Patent
Li et al.

(10) Patent No.: US 7,682,457 B2
(45) Date of Patent: Mar. 23, 2010

(54) FRONTSIDE STRUCTURE DAMAGE PROTECTED MEGASONICS CLEAN

(75) Inventors: Zhiyong Li, San Jose, CA (US); Jianshe Tang, San Jose, CA (US); Bo Xie, Sunnyvale, CA (US); Wei Lu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 11/973,039

(22) Filed: Oct. 4, 2007

(65) Prior Publication Data

US 2009/0090381 A1 Apr. 9, 2009

(51) Int. Cl.
*B08B 3/12* (2006.01)

(52) U.S. Cl. .................. 134/1; 134/1.3; 134/2; 134/3; 134/26; 134/28; 134/32; 134/33; 134/34; 134/36; 134/40; 134/41; 134/42; 134/902

(58) Field of Classification Search ......... 134/1, 134/1.3, 2, 3, 26, 28, 32, 33, 34, 36, 40, 41, 134/42, 902
See application file for complete search history.

(56) References Cited

U.S. PATENT DOCUMENTS

| | | | |
|---|---|---|---|
| 5,377,709 A * | 1/1995 | Shibano | 134/184 |
| 5,800,626 A * | 9/1998 | Cohen et al. | 134/1.3 |
| 6,059,886 A * | 5/2000 | Shibano | 134/1 |
| 6,284,055 B1 * | 9/2001 | Dryer et al. | 134/10 |
| 6,295,998 B1 | 10/2001 | Kudelka et al. | |
| 6,927,176 B2 | 8/2005 | Verhaverbeke et al. | |
| 2002/0029788 A1 | 3/2002 | Verhaverbeke et al. | |
| 2003/0045131 A1 * | 3/2003 | Verbeke et al. | 438/795 |
| 2003/0192577 A1 | 10/2003 | Thakur et al. | |
| 2006/0042651 A1 * | 3/2006 | Verhaverbeke et al. | 134/1 |
| 2007/0056605 A1 * | 3/2007 | Fraklin et al. | 134/1.3 |
| 2007/0084481 A1 * | 4/2007 | Franklin | 134/1.3 |
| 2008/0029125 A1 * | 2/2008 | Olesen et al. | 134/1.3 |
| 2008/0169007 A1 * | 7/2008 | Kashkoush et al. | 134/28 |
| 2009/0090381 A1 * | 4/2009 | Li et al. | 134/1 |

* cited by examiner

*Primary Examiner*—Sharidan Carrillo
(74) *Attorney, Agent, or Firm*—Blakely Sokoloff Taylor & Zafman LLP

(57) ABSTRACT

An apparatus and method for removing contaminants from a workpiece is described. Embodiments of the invention describe placing a workpiece on a holding bracket within a process chamber to hold and rotate the workpiece to be cleaned. A first cleaning fluid is provided to the workpiece non-device side, while a degasified liquid is provided to the workpiece device side during megasonic cleaning. The degasified liquid inhibits cavitation from occurring on and damaging the device side of the workpiece during megasonic cleaning.

15 Claims, 11 Drawing Sheets

FRONTSIDE STRUCTURE DAMAGE PROTECTED MEGASONICS CLEAN

BACKGROUND OF THE INVENTION

1. Field of the Invention

The present invention relates to the field of cleaning a workpiece surface. More particularly this invention relates to the area of megasonic cleaning of a semiconductor wafer.

2. Discussion of Related Art

The increasing process complexity and introduction of new materials at the 45 nm and 32 nm technology nodes has given rise to a greater number of processing steps and correspondingly to the number of cleaning steps required in order to maintain yields. Accordingly, wafer cleaning has become the most frequently repeated operation in IC manufacturing. One of the main goals is to remove contaminants such as particles from the wafer surface and additionally from other semiconductor workpiece surfaces such as lithography tools, including patterned lithography masks.

Cleaning operations have traditionally concentrated on the front end of the line (FEOL) processing where active devices are exposed and detailed cleans are required. On the device side of the wafer, it is necessary to remove contaminants which could cause a malfunctioning device. Contamination on the non-device side (backside) of the wafer can also cause a number of problems. For example, backside particle contamination can cause a photolithography step on the front side to be out of focus, which can cause significant plant downtimes. In other occasions, a deposition tool deposits a material on the front side on the wafer but inadvertently also deposits some film on the backside of the wafer. In copper electroplating tools, for example, copper contamination can end up on the backside of the wafer. In all these cases, the backside has to be cleaned of particles and/or dissolved metals or certain layers have to be stripped.

The RCA clean, a wet-chemical cleaning method developed in 1965, still forms the basis for most FEOL wet cleans. A typical RCA-type cleaning sequence comprises a first alkaline standard clean (SC1) solution, commonly containing hydrogen peroxide ($H_2O_2$) and ammonium hydroxide ($NH_4OH$) in deionized water for removal of organic and particulate contaminants, followed by a second standard clean (SC2) solution, commonly containing hydrogen peroxide and hydrogen chloride (HCl) in deionized water for removal of metallic impurities. Often a high pH and temperature of the SC1 solution is required to remove particles. This has a detrimental effect of etching the wafer surface and can be too aggressive for many critical cleaning steps.

The recent introduction of megasonics assisted cleaning techniques has allowed for better particle removal efficiency with cleaning solutions that are substantially less aggressive and thus less harmful to the surface of the wafer. Megasonic energy is typically applied to a cleaning solution by sonicating the cleaning solution with high energy acoustic waves. The cleaning ability of megasonic energy is largely attributed to various combinations of cavitation and acoustic streaming. Acoustic streaming is the result of the high energy acoustic waves propagating through the cleaning solution. Acoustic streaming generally lifts off particles off surfaces with shear stresses. Cavitation includes gas bubble oscillation and implosion in the cleaning solution resulting from the pressure changes of acoustic waves moving through the cleaning solution. Cavities may form when the liquid pressure momentarily drops below the vapor pressure during the low pressure portion of the acoustic wave. Typically the cavities preferentially form at the site of imperfections (for example, dissolved gas bubbles) in the liquid which serve as nuclei for cavitation. When a high enough pressure amplitude, called cavitation threshold, is reached the nucleus becomes unstable and rapidly grows into a transient cavity which may then violently implode. Bubble implosion near the wafer surface can be a significant contributor to particle removal. However, the violent implosions associated with cavitation can also destroy fragile patterns on the wafer device side.

Various methods have been developed in an attempt to remove particles from a wafer backside without damaging the fragile patterns on the wafer front device side. One such proposal is to clean the backside of a wafer by exposing only the backside of the wafer to megasonic energy. However, at high powers associated with megasonic cleaning, energy propagates from the wafer backside, through the wafer, and to the wafer device side and is capable of damaging fragile structures on the device side. Additionally, the energy that propagates to the wafer device side is capable producing cavitation in the cleaning solutions on the wafer device side.

Another proposal has been to reduce the size of cavities that form and implode on the device side by increasing the megasonic frequency. As megasonic frequency is increased, the amount of time between pulses is shortened resulting in smaller cavitation bubbles which in turn produce less violent collapse. However, raising the megasonic frequency, while resulting in "controlled" cavitation on the device side, also has the detrimental effect of reduced cleaning efficiency on the wafer backside, particularly for larger particles. Even more, while previous technology nodes utilized patterns on the device side, such as poly-lines, that could withstand the less violent implosions associated with "controlled" cavitation, patterns in the 45 nm and 32 nm nodes are becoming so fragile that megasonic agitation may break them and cause a defective device.

Therefore, what is needed is a cleaning method that is capable of removing particles from the backside of a semiconductor workpiece (wafer, mask, etc.) while at the same time also eliminating unwanted etching and damage on the fragile device side of the semiconductor workpiece.

SUMMARY OF THE INVENTION

An apparatus and method is disclosed for megasonic cleaning of a workpiece while protecting the device side surface from structural damage. The workpiece can be placed in a rotatable holding bracket to hold and rotate the workpiece within a cleaning chamber. A degasified liquid is provided to the workpiece device side and is either directly or indirectly exposed to megasonic energy. The degasified liquid inhibits cavitation from occurring on and damaging the device side of the workpiece.

DETAILED DESCRIPTION OF THE PRESENT INVENTION

Figure 1:
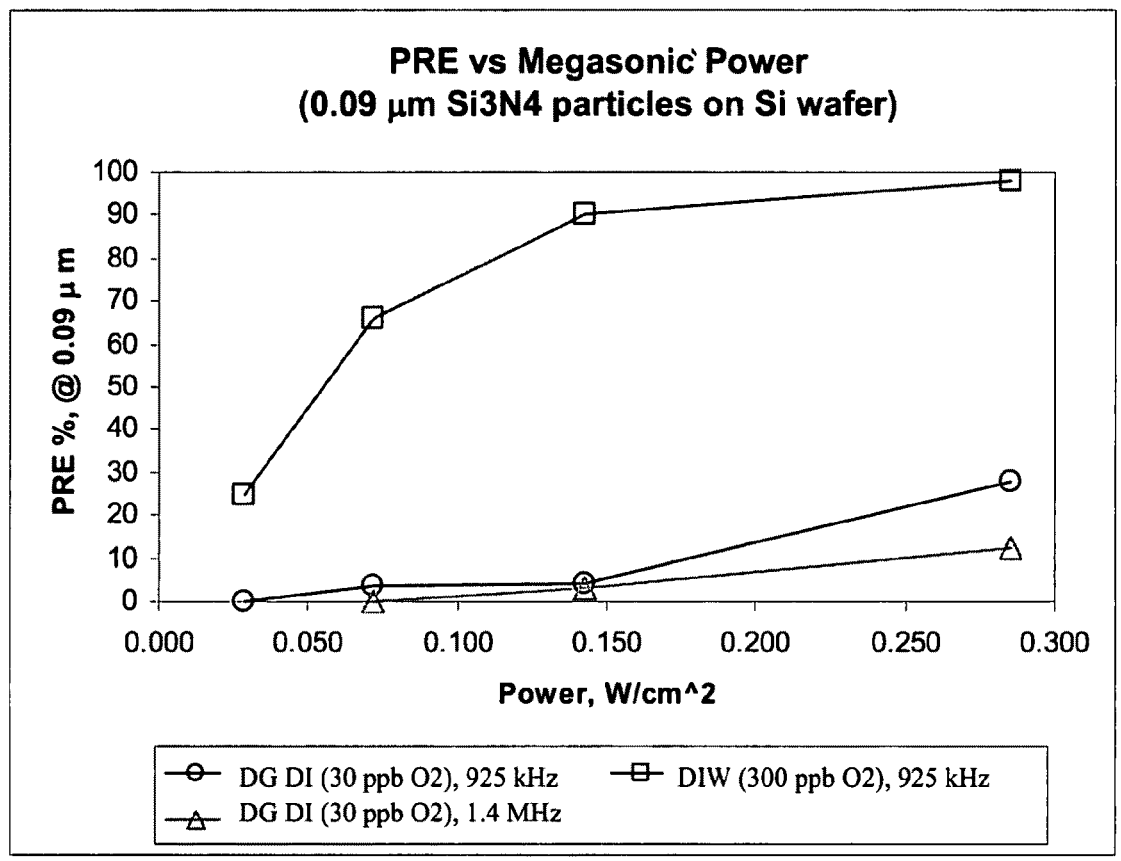
FIG. 1 is a graphical representation of experimental results for 0.09 µm Si3N4 particle removal efficiency as a function of megasonic power density for sample silicon wafers cleaned in both gas containing and degasified megasonic cleaning baths.

Embodiments of the present invention disclose an apparatus and method for megasonic cleaning of a workpiece while protecting the device side surface from structural damage.

In various embodiments, an apparatus and method for megasonic cleaning is described with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

Embodiments of the invention are described with reference to a workpiece having a device side and non-device side. The term "device" in semiconductor processing is commonly understood as essentially any homogenous or multilayer piece of semiconductor material which is processed in such way that it can perform in the controlled fashion predetermined electronic (e.g. diode, transistor, monolithic integrated circuit) or photonic (e.g. LED, laser) function. However, it is also within the scope of the invention for the term "device side" to include other components, such as semiconductor masks. For example, the device side of a photo mask may be a side including areas of opaque chrome on the surface of a transparent quartz plate, and the non-device side may be the opposite side of the transparent quartz plate. Whether the workpiece device side is the surface of a silicon wafer upon which a transistor is formed or the surface of a quartz substrate upon which opaque materials are placed to form a photomask, one common characteristic is that the device side may be more fragile than the non-device side. Thus, embodiments of the invention provide an advantageous apparatus and method for cleaning a workpiece with a fragile device side.

Wafer cleaning steps have become the most frequently repeated operation in IC manufacturing. As the technology nodes continue to shrink past the 45 nm and 32 nm nodes, even sub-micron particles located on the wafer backside can cause a photolithography step on the front side of the wafer to be out of focus. Accordingly, it is becoming ever more important to remove all such particles on the wafer backside prior to performing any lithography steps on the wafer device side.

Embodiments of the invention describe a single workpiece cleaning system and method for cleaning the backside of a workpiece, while protecting the fragile device side of the workpiece from structural damage. A single workpiece (ex. silicon wafer) is placed on a rotatable holding bracket within a cleaning chamber. The wafer backside is then exposed to a cleaning fluid, and the wafer device side is exposed to a degasified liquid. Megasonic energy is supplied to the cleaning fluid, which acts as a carrier for transferring megasonic energy to the wafer backside and removing contamination from the wafer backside. The megasonic energy propagates through the wafer to the wafer device side, and to the degasified liquid on the device side surface. Because the liquid is degasified, there is no cavitation, and hence no structural damage on the wafer device side surface even if exposed to high power megasonic energy.

The term "degasified" liquid used herein means the liquid has a dissolved gas concentration less than would be present in an equilibrium state at operating pressure and temperature. For example, deionized water at room temperature and standard pressure contains approximately 300 ppb of dissolved O2 gas at equilibrium. Therefore, deionized water containing less than approximately 300 ppb O2 at room temperature and standard pressure would be "degasified" as described herein. However, it is to be appreciated that gas concentrations such as, but not limited to, N2 and CO2 may alternatively and/or additionally be measured in order to determine whether a liquid is degasified.

FIG. 1 is a graph of experimental results for 0.09 μm Si3N4 particle removal efficiency (PRE) as a function of megasonic power density for sample silicon wafers cleaned in both gas containing and degasified megasonic cleaning baths. Cleaning baths were either deionized (DI) water containing approximately 300 ppb O2 gas or degasified deionized (DG DI) water containing approximately 30 ppb O2 gas. As shown in FIG. 1, samples cleaned in gas containing DI water were found to have greater than 90% PRE at 925 kHz and 0.25 W/cm$^2$. Samples cleaned in DG DI water were found exhibit far less PRE, below 30%. In addition, PRE was found to not depend significantly on frequency for samples cleaned in DG DI water. Samples cleaned at 925 kHz and 1.4 MHz in DG DI water were both found to have very low PRE.

It is significant that the samples cleaned in DG DI water exhibited significantly lower PRE than those samples cleaned in DI water. This relationship suggests that while degasifying a cleaning solution is detrimental to the cleaning process, because there is significantly less cleaning, there is also a significant reduction in damage to the fragile device patterns. It is expected that degasifying the cleaning solution removes the nuclei for cavitation formation, and hence the primary source for surface damage. Accordingly, embodiments of the present invention provide an apparatus and method for megasonic cleaning the backside of a workpiece in which the detrimental effects of cavitation are minimized on the fragile device side surface of the workpiece by providing a degasified liquid to the fragile device side surface during megasonic cleaning.

Figure 2A:
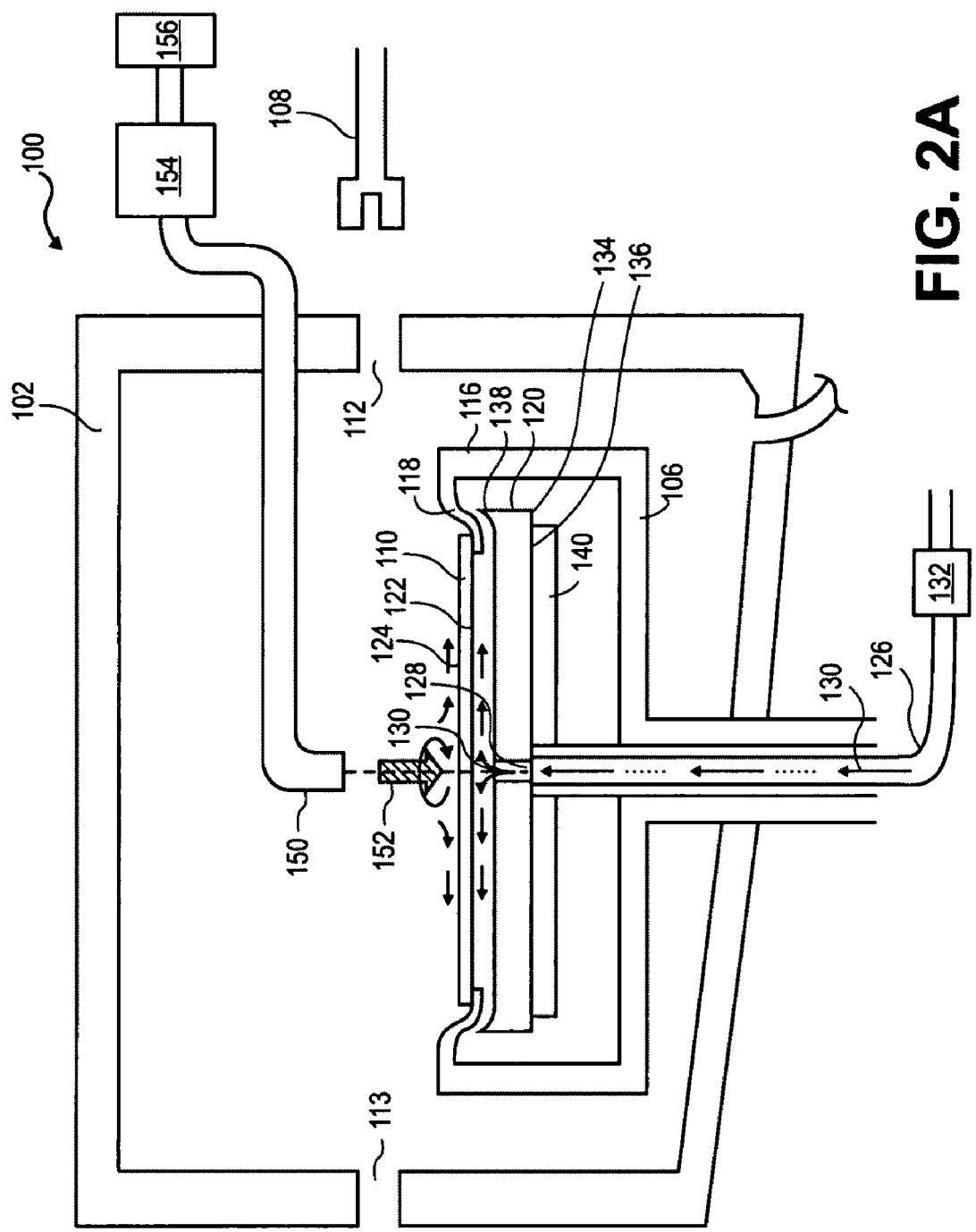
FIG. 2A is an illustration of a cross-sectional view of one embodiment of a single workpiece cleaning system.

FIG. 2A is an illustration of a cross-sectional view of one embodiment of a single workpiece cleaning system 100. As shown in FIG. 2A, a single workpiece cleaning chamber 102 includes a rotatable workpiece holding bracket 106 to hold a single workpiece such as a silicon wafer or photo mask. In one embodiment, a robot arm 108 holding a workpiece 110 enters the chamber 102 through an opening 112. In one embodiment, opening 112 is a dry opening, meaning that the workpiece has yet to be cleaned. Chamber 102 may also include an additional opening 113. In one embodiment, opening 113 is a wet opening, meaning that the workpiece has been cleaned. The robot arm 108 places the workpiece 110 onto the rotatable bracket 106. In one embodiment, the workpiece non-device side (backside) 122 is facing down, while the workpiece device side 124 is facing up.

Figure 2B:
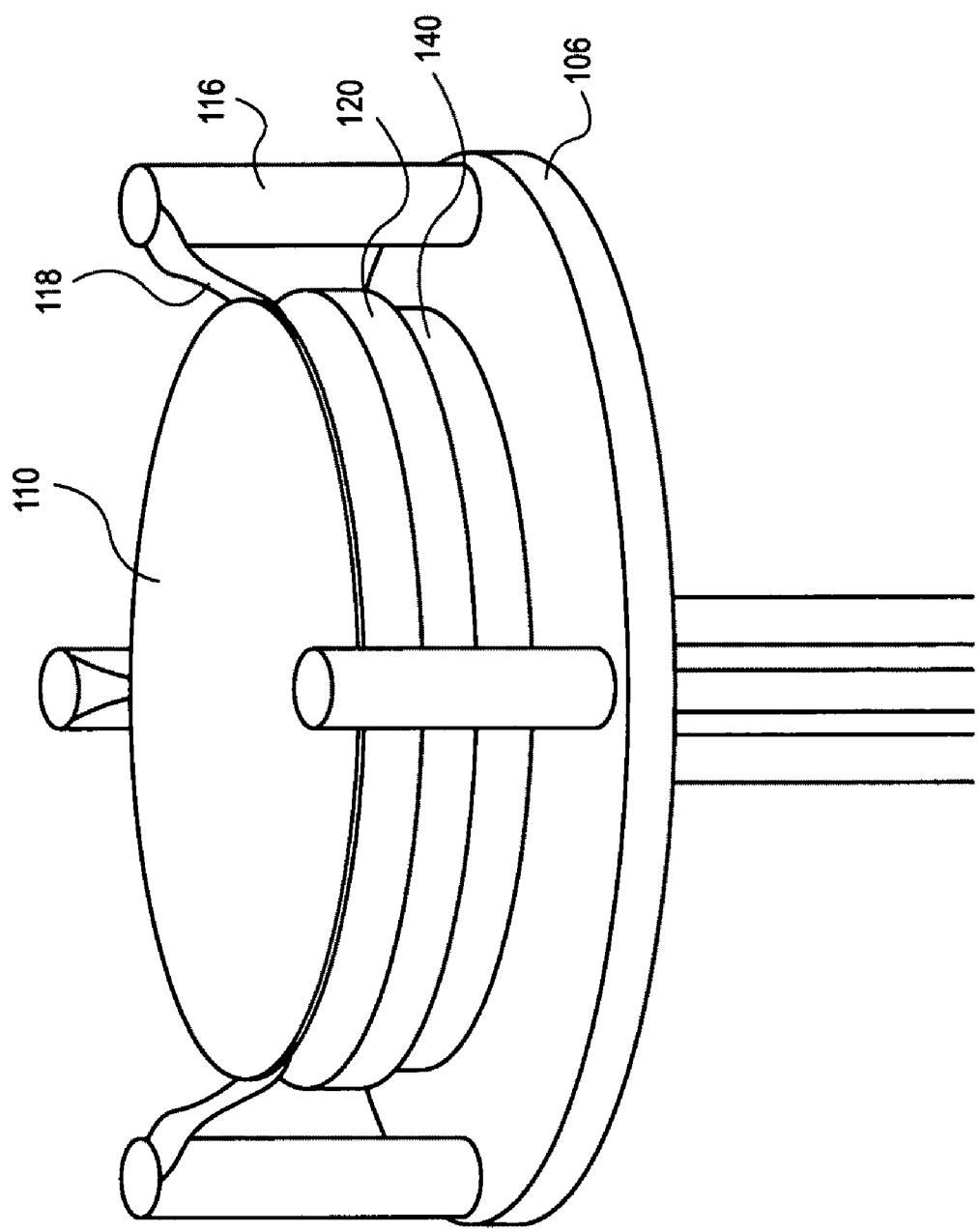
FIG. 2B is an illustration of an isometric view of one embodiment of a rotatable wafer holding bracket and platter.

As shown in FIG. 2B, bracket 106 has a multiplicity of vertical support posts 116 and corresponding fingers 118 upon which the workpiece 110 is placed. Bracket 106 can be raised and lowered while maintaining the workpiece 110 parallel and adjacent to a platter 120. Alternatively, the bracket 106 is in a fixed position. In one embodiment, the platter 120 is circular, having a diameter slightly larger than the workpiece 110. The top surface of platter 120 located beneath the workpiece 110 is flat, and therefore the distance separating the planter 120 and workpiece 110 is uniform.

Prior to or during the cleaning portion of the process, platter 120 may be raised so as to align platter 120 horizontally a distance from the workpiece 110. The gap between the workpiece 110 and the platter 120 is in the range of approximately 1-5 mm and preferably approximately 3 mm. Thus, it would be apparent to one skilled in the art that either bracket 106, platter 120, or both can be raised or lowered in order to establish an optimum gap distance.

During the cleaning portion of the process, workpiece 110 is rotated by the rotatable holding bracket 106 while one or more fluid 130 is dispensed from below the workpiece 110 to the contact the workpiece backside 122. However, the workpiece rotation may also be stopped allowing the workpiece 110 to remain still while fluid 130 contacts the workpiece backside 122. In an embodiment fluid 130 is a cleaning fluid such as deionized water, gasified deionized water, SC1 clean, SC2 clean, or dilute HF. Fluid 130 may be any cleaning fluid useful in megasonic cleaning. In another embodiment fluid 130 is a modified cleaning solution containing ammonium hydroxide, water, and a chelating agent. In an embodiment the fluid 130 also contains a surfactant.

Referring again to FIG. 2A, a tube 126 connects to a through hole (feed port) 128 in the platter 120 to deliver fluid 130 to the workpiece backside 122. In one embodiment, the through hole 128 is approximately 0.190 inches in diameter. In another embodiment, fluid 130 is a sonicated liquid. In such an embodiment, the fluid 130 is sonicated prior to entering the through hole 128 in platter 120. In one embodiment, tube 160 passes through an external sonicating unit 132 in order to sonicate fluid 130 prior to entering the through hole 128.

Platter 120 has a topside 134 and a bottom side 136. In one embodiment, platter 120 contains raised edges 138 that function to contain the fluids 130 near the workpiece bottom surface 122 and assist with wetting and transferring megasonic energy to workpiece 110. In one embodiment, platter 120 has a set of transducers 140 attached to the bottom side 136 for providing acoustic energy. In such an embodiment, platter 120 is made of a material that efficiently transmits acoustic energy such as stainless steel or aluminum. In one embodiment, multiple transducers 140 substantially cover the entire bottom side 136 of platter 120, and generate sonic waves in the frequency range between 400 kHz and 8 MHz in a direction perpendicular to the bottom surface 122 of workpiece 110. In another embodiment, transducer 140 is a single plate having approximately the same diameter as platter 120. In another embodiment, transducers 140 are not attached to platter 120. In such an embodiment, platter 120 is not required to efficiently transmit acoustic energy and is composed of plastic, for example.

A second fluid outlet 150 is positioned above the platter 120 and workpiece 110 to provide a degasified liquid 152 to the workpiece 110 device side 124. In one embodiment, the second fluid outlet is a nozzle 150. The nozzle 150 flows a degasified liquid 152 to the workpiece 110 device side 124 while the workpiece 110 is stationary, while the workpiece 110 is rotating, or being raised or lowered. The nozzle 150 applies the degasified liquid 152 at a sufficient flow rate to maintain a film coating of the degasified liquid 152 on the workpiece device side surface 124.

In one aspect, flowing a degasified liquid 152 to the device side 124 provides a reduced cavitation medium for when megasonic energy is transferred, directly or indirectly, to a workpiece device side 124. Because the liquid 152 is degasified, cavitation does not occur on the device side surface 124 even under high power megasonics. In one embodiment, megasonic energy is transferred to degasified liquid 152 via propagation through the workpiece 110. In another embodiment, megasonic energy can be directly provided to the degasified liquid 152.

In another aspect, flowing a degasified liquid to the device side 124 also provides an effective solution to the splashing of the cleaning fluids 130 inherent when the bracket 106 finger structure is rotated. The degasified liquid 152 dilutes and efficiently carries away the cleaning fluids 130 that may migrate or splash onto the workpiece device side 124 during the cleaning operation.

In one embodiment the degasified liquid 152 is deionized water with an O2 gas concentration below approximately 30 ppb. However, it is to be appreciated that gas concentrations such as, but not limited to, N2 and CO2 may alternatively and/or additionally be measured in order to determine whether a liquid is degasified. In one embodiment, degasified liquid 152 has an N2 and/or CO2 concentration below approximately 30 ppb. In another embodiment, degasified liquid 152 has a total gas concentration (including at least O2, N2, and CO2) below approximately 30 ppb. In another embodiment the degasified liquid 152 has a gas concentration below approximately 10 ppb.

In one embodiment, degasified liquid 152 is deionized and diluted HF. In yet another embodiment, degasified liquid 152 is a stable liquid which does not readily decompose to form a gas. For example, the hydrogen peroxide present in many standard cleaning solutions might break down to form water and gaseous O2 upon sonication, thus providing a source for cavitation on the fragile device side. Therefore, in such an embodiment, a solution containing hydrogen peroxide would be a less suitable candidate for degasified liquid 152.

In one embodiment, fluid outlet 150 is flow connected to a degasifier unit 154, which in turn is flow connected to a deionized water source 156. The degasifier unit 154 vacuum degases the deionized water before flowing the deionized water to outlet 156 by, for example, passing the deionized water through a membrane degasifier such as with Liqui-Cel membrane contactors as supplied by Celgard (Charlotte, N.C.). In one embodiment, deionized water source 156 is the plant facility deionized water source. In an alternative embodiment, source 156 provides degasified deionized water and is inclusive of degasifier unit 154.

Figure 3:
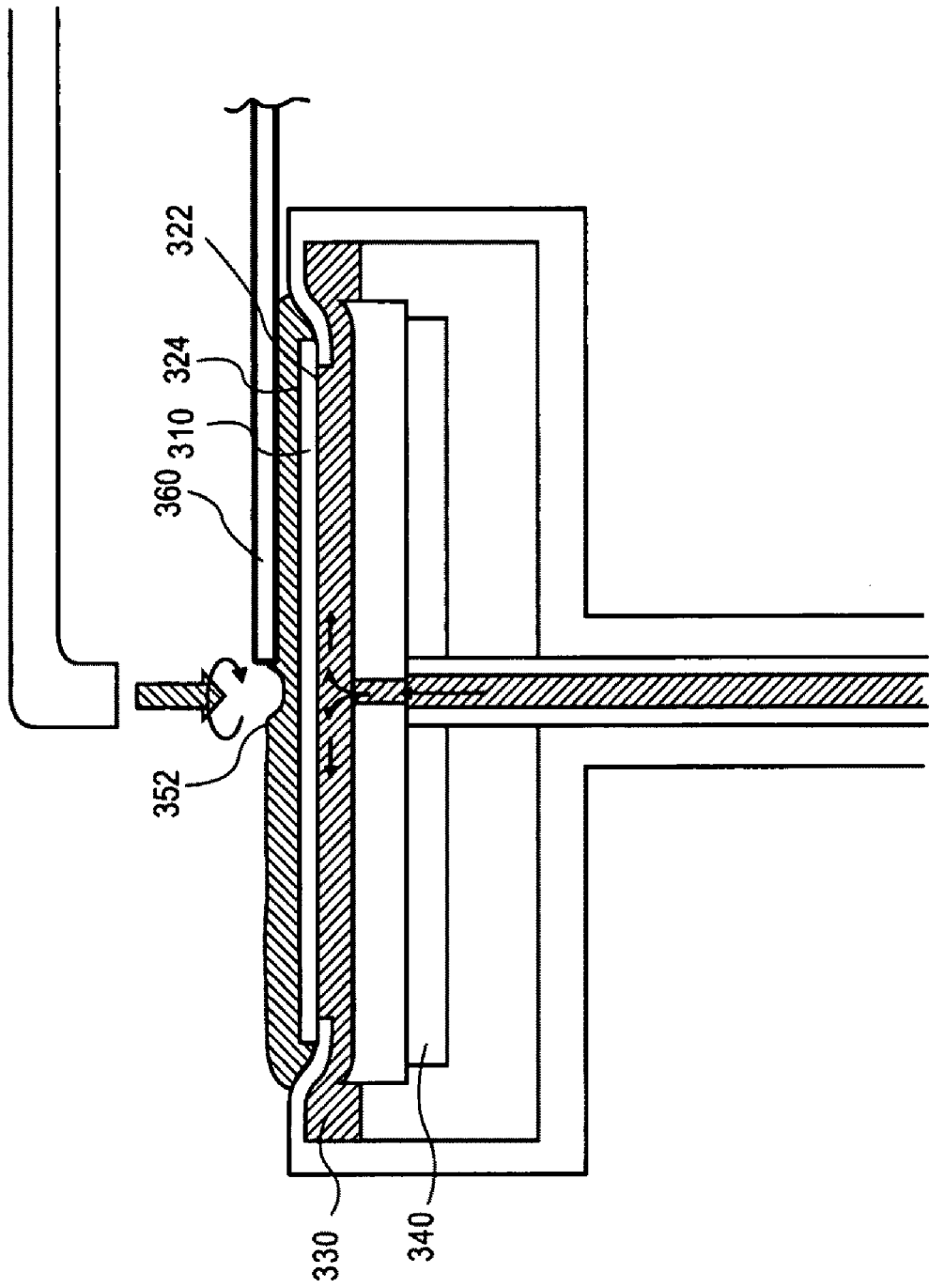
FIG. 3 is an illustration of a cross-sectional view of one embodiment where at least one megasonic bar is positioned above the device side surface.

FIG. 3 is an illustration of one embodiment where at least one megasonic bar 360 is positioned above the device side surface 324 in order to transmit acoustic energy directly to the degasified liquid 352 and on to the device side surface 324. The megasonic bar 360 is positioned such that it is adjacent and parallel to the workpiece device side surface 324. The megasonic bar 360 should be close enough to the workpiece surface 324 such it touches the film of degasified liquid 352 on the device side surface 324. In one embodiment the gap between the workpiece surface 324 and megasonic bar 360 is in the range of approximately 1-5 mm and preferably approximately 3 mm, and the degasified liquid 352 film thickness is greater than 3 mm. In such an embodiment, the megasonic bar 360 directly transfers sound pressure waves to the degasified liquid 352 and on to the workpiece device side surface 324. In another embodiment, transducers 340 also indirectly transfer sound pressure waves to the degasified liquid 352 during a backside clean, whereby transducers 340 directly provide sound pressure waves to fluid 330 in contact with the workpiece backside 322, the sound pressure wavers propagate through workpiece 310 and to degasified liquid 352 on the workpiece device side surface 324. Thus, the apparatus of FIG. 3 is capable of simultaneously performing a cleaning operation on both the device side 324 and backside 322 of a workpiece.

Figure 4:
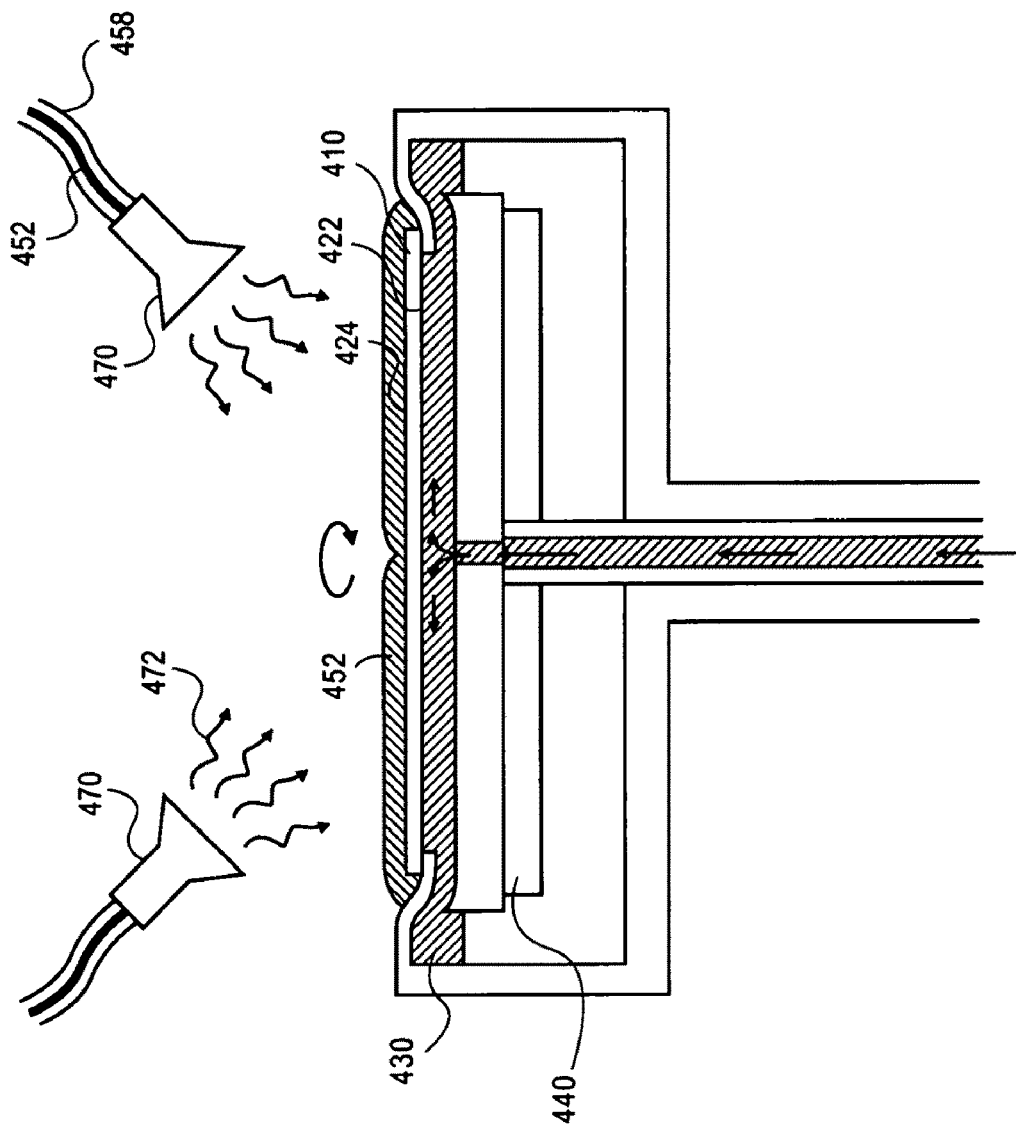
FIG. 4 is an illustration of a cross-sectional view of one embodiment where at lest one megasonic spray nozzle is positioned above the device side surface.

FIG. 4 is an illustration of one embodiment where at least one megasonic spray nozzle 470 is used to transmit acoustic energy directly to the degasified liquid 452 and on to the device side surface 424. A tube 458 transfers degasified liquid 452 to nozzle 470. Megasonic nozzle 470 provides megasonic energy to the degasified liquid 452 and emits degasified liquid megasonic spray 472. The degasified liquid megasonic spray 472 strikes the workpiece device side surface 424 thereby directly transferring megasonic energy to the workpiece device side surface 424. In another embodiment, transducers 440 also indirectly transfer sound pressure waves to the degasified liquid 452 during a backside clean, whereby transducers 440 directly provide sound pressure waves to fluid 430 in contact with the workpiece backside 422, the sound pressure wavers propagate through workpiece 410 and to degasified liquid 452 on the workpiece device side surface 424. Thus, the apparatus of FIG. 4 is capable of simultaneously performing a cleaning operation on both the device side 424 and backside 422 of a workpiece.

In utilizing the various aspects of this invention, it would become apparent to one skilled in the art that combinations or variations of the above embodiments are possible for supplying megasonic energy to a degasified liquid on the device side surface of a workpiece.

Figure 5:
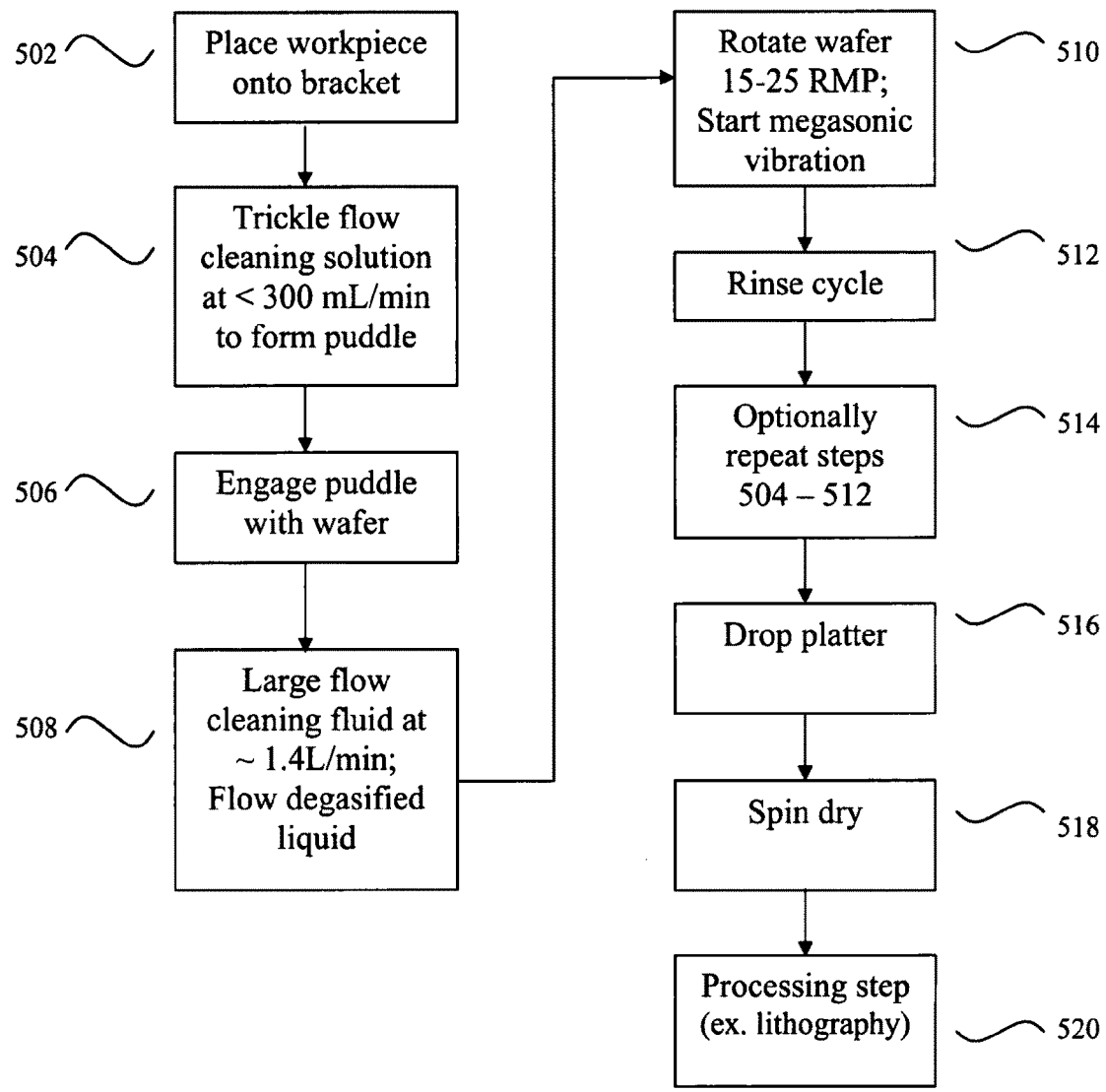
FIG. 5 is a flow diagram of one embodiment for a method of removing contaminants from a workpiece.

FIG. 5 is a flow diagram of one embodiment for a method of removing contaminants from a workpiece, such as a silicon wafer, using the system of FIG. 2A. At block 502, a robot arm 108 holding a workpiece 110 enters chamber 102 through an opening 112. The robot arm 108 places the workpiece 110 onto a rotatable bracket 106. In one embodiment, opening 112 is a dry opening, meaning that the workpiece has yet to be cleaned. In one embodiment, the workpiece is placed onto the rotatable bracket 106 with the non-device side (backside) 122 facing down and the workpiece device side 124 facing up.

The components within chamber 102 are then moved to a cleaning position. In one embodiment, after receiving workpiece 110, the rotatable bracket 106 is lowered so as to align the workpiece 110 horizontally a distance from the platter 120. In one embodiment, the workpiece is lowered to a cleaning position where the gap between the workpiece 110 and platter 120 is in the range of approximately 1-5 mm and preferably 3 mm. In yet another embodiment, the rotatable bracket 106 remains stationary, and instead platter 120 is raised to the cleaning position where the gap between the workpiece 110 and platter 120 is in the range of approximately 1-5 mm and preferably 3 mm.

After positioning the components in a cleaning position, the fluid outlet 150 is then moved to a centered position above the platter 120 and workpiece 110 to provide a degasified liquid 152 to the workpiece 110 device side 124 (topside). In one embodiment, the second fluid outlet 150 is a nozzle.

Figure 6:
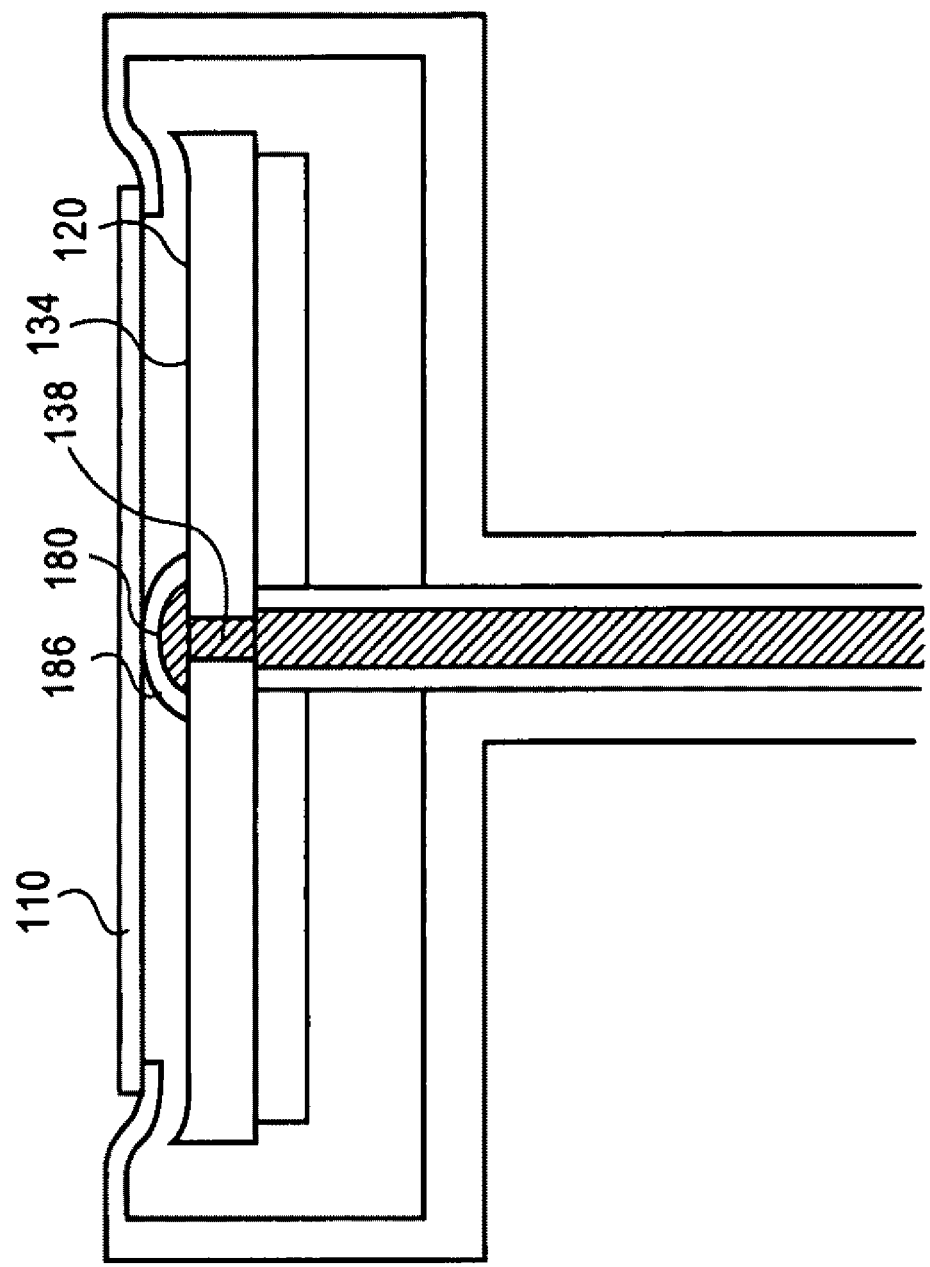
FIG. 6 is an illustration of a cross-sectional view of a puddle forming on the top surface of the platter.

A cleaning fluid 130 is then trickle flowed through the through hole (feed port) 128 in platter 120 to the platter topside 134, as shown in block 504. In one embodiment, during trickle flow, cleaning fluid 130 flows at a rate of less than approximately 300 mL/min for approximately 5 seconds. As shown in FIG. 6, trickle flow is performed in order to form a puddle 180 on the platter topside 134. The workpiece 110 remains stationary, or alternatively is rotated during trickle flow. In one embodiment, workpiece 110 is rotated at a rate of less than approximately 15 RPM.

Figure 7:
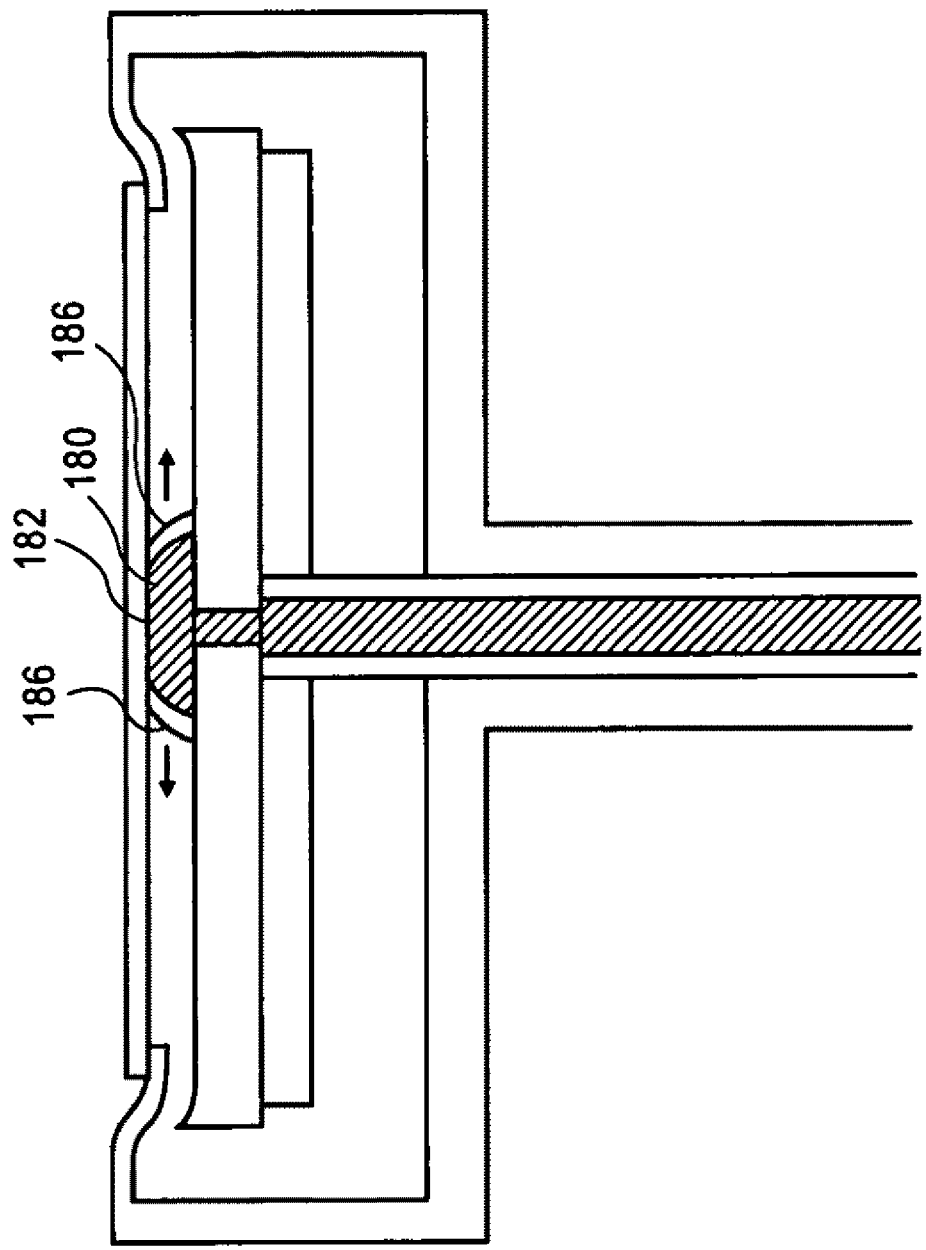
FIG. 7 is an illustration of a cross-sectional view of the meniscus of the puddle in FIG. 6 touching the workpiece.
Figure 8A:
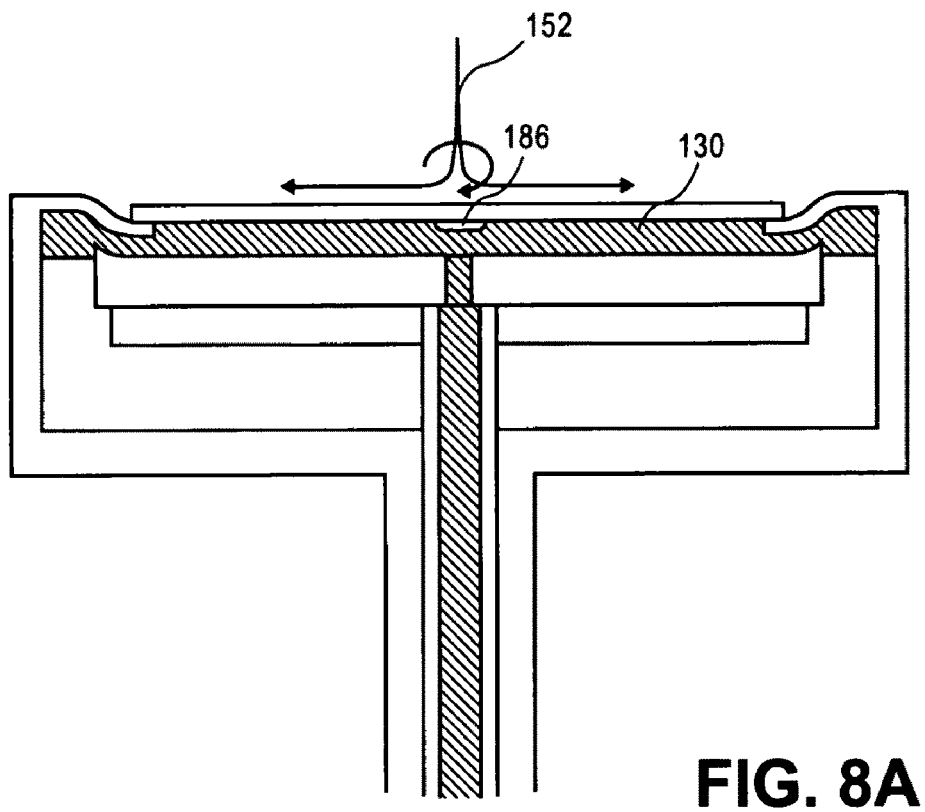
FIG. 8A is an illustration of a cross-sectional view of an air pocket formed beneath the workpiece.

At block 506, the puddle 180 engages the workpiece 110. In one embodiment, the platter 120 is raised to a cleaning position during trickle flow, where the gap between the workpiece 110 and platter 120 is in the range of approximately 1-5 mm and preferably 3 mm. Alternatively, the components are already in a cleaning position, and puddle 180 engages the workpiece 110 without any additional raising or lowering of the rotatable bracket 106 or platter 120. In one embodiment, trickle flow of cleaning fluid 130 is continued while workpiece 110 is rotated at a rate of less than approximately 15 RPM. As shown in FIG. 7, the meniscus 182 of the puddle 180 is smeared by the rotating workpiece 110. In one aspect, rotating the workpiece helps to keep puddle 180 centered on the platter 120, and to prevent puddle 180 migration to one side of platter 120. This is particularly beneficial if the platter topside 122 is not completely flat and horizontal. In another aspect, slowly contacting the puddle to the workpiece 110 helps prevent the formation of air pockets 186 beneath the workpiece 110 bottom surface 122 (as shown in FIG. 8A) which can occur if cleaning fluid 130 is initiated with a large flow rate. Instead, (as shown in FIG. 7) as the puddle smears on the bottom surface 122 of workpiece 110, air pockets 186 are squeezed out of the area separating the workpiece 110 and platter 120, thus creating a medium for uniform cleaning.

Figure 8B:
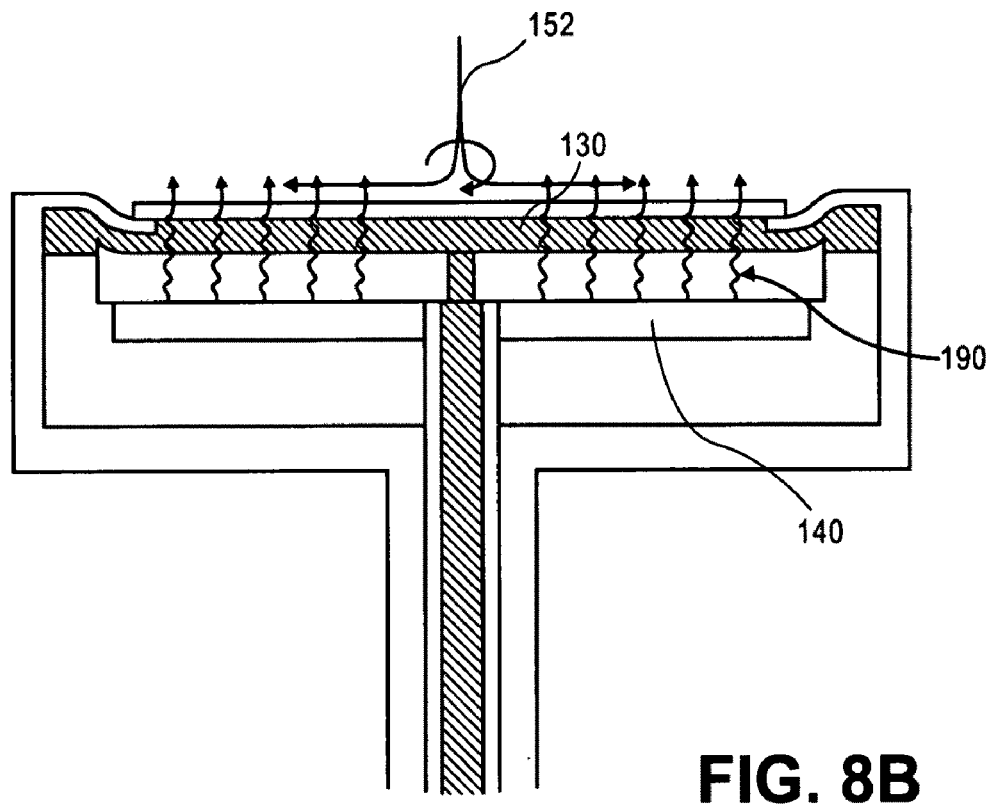
FIG. 8B is an illustration of a cross-sectional view of a cleaning fluid filling the area between the workpiece and platter without the formation of air pockets.

At block 508, the flow rate of cleaning fluid 130 is increased and the degasified liquid 152 is flowed to the workpiece 110 device side 124 at a sufficient flow rate (for example, 1.1 L/min for a 300 mm wafer) to maintain a coating of the degasified liquid 152 on the workpiece device side surface 124. In one embodiment, the increase in flow rate of cleaning fluid 130 and starting the flow of the degasified liquid 152 occurs simultaneously. The flow rate of cleaning fluid 130 is increased to a large flow sufficient to push air pockets 186 out to prevent a bubble from forming underneath workpiece 110. In one embodiment the flow rate of cleaning fluid 130 is increased to a large flow rate of approximately 1.4 L/min. As shown in FIG. 8B, cleaning fluid 130 fills the area between workpiece 110 and platter 120 without the formation of air pockets. In one embodiment, cleaning fluid 130 is either an SC1 cleaning solution, SC2 cleaning solution, or diluted HF and the degasified liquid 152 is deionized water. In another embodiment fluid 130 is a modified cleaning solution containing ammonium hydroxide, water, and a chelating agent. In an embodiment the fluid 130 also contains a surfactant.

The workpiece 110 rotation is increased and megasonic energy is provided to workpiece 110, as shown in block 510. In one embodiment, the workpiece 110 rotation is increased to between approximately 15 RMP and 25 RPM. As shown in FIG. 8B, megasonic energy 190 is directly provided to the cleaning solution 130 and on to the workpiece backside surface 122 by turning on acoustic wave transducers 140. In one embodiment, acoustic wave transducers 140 is a plate with a diameter approximately the size of the platter 120 sized for a 300 mm wafer, and is turned on to a power of approximately 500 W to 1,000 W at a frequency of 925 kHz to 1.4 MHz, and preferably 1,000 W at 925 kHz, for a period of approximately 30 seconds. In such an embodiment, transducer plate 140 generates a power density of approximately 1.4 W/cm$^2$.

The workpiece is then put through a rinse cycle, as shown in block 512. In one embodiment, cleaning fluid 130 is shut off, and degasified liquid 152 continues to flow onto the device side surface 124 at a flow rate of 1.1 L/min for approximately 60 seconds while the workpiece 110 is rotated at approximately 25-200 RPM. At the end of the rinse cycle in step 512, the flow of degasified liquid 152 is shut off. Then, as shown at block 514, the processes in blocks 504 through 512 may optionally be repeated. In one embodiment for a pre-lithography sequence, a first cycle is performed using diluted HF as cleaning fluid 130, followed by a second cycle using an SC1 cleaning solution as cleaning fluid 130, and a third cycle using an SC2 cleaning solution as cleaning fluid 130. There is usually a DI water rinse between cycles. In another embodiment a first cycle is performed using a diluted HF as cleaning fluid 130, followed by a second cycle using a modified cleaning fluid 130 containing ammonium hydroxide, water, and a chelating agent. It would be apparent to one skilled in the art to use other combinations and sequences of cleaning solutions consistent with those embodiments described herein.

At block 516, the components are repositioned such that the gap between the workpiece and platter 120 is increased. In one embodiment, platter 120 is lowered so the gap is between 5-100 mm. In another embodiment, the gap is greater than 100 mm.

The workpiece is then put through a spin dry cycle, as shown in block 518. In one embodiment, the workpiece 110 is rotated at a rate of approximately 1,000 RPM for approximately 30 seconds. Additionally, the step 516 of lowering platter 120 may be performed before, during, or after step 518.

Following the spin dry step 518, the workpiece 110 is then transferred out of cleaning chamber 102 using a robot arm to transfer the workpiece 110 through opening 112. The workpiece 110 is than transferred to any suitable processing step, such as a lithographic processing step, as shown in block 520. In one embodiment, photo resist is applied workpiece 110, and workpiece 110 is then baked, and then the photo resist is exposed to a lithographic wavelength such as 193 nm or 248 nm UV light in a lithographic tool. Utilizing embodiments of the present invention, the workpiece 110 backside 122 is free of particle contamination which could cause misalignment during the lithography step, and the fragile device side 124 of workpiece 110 is free of structural damage because of the degasified liquid 152 utilized during cleaning.

Figure 9:
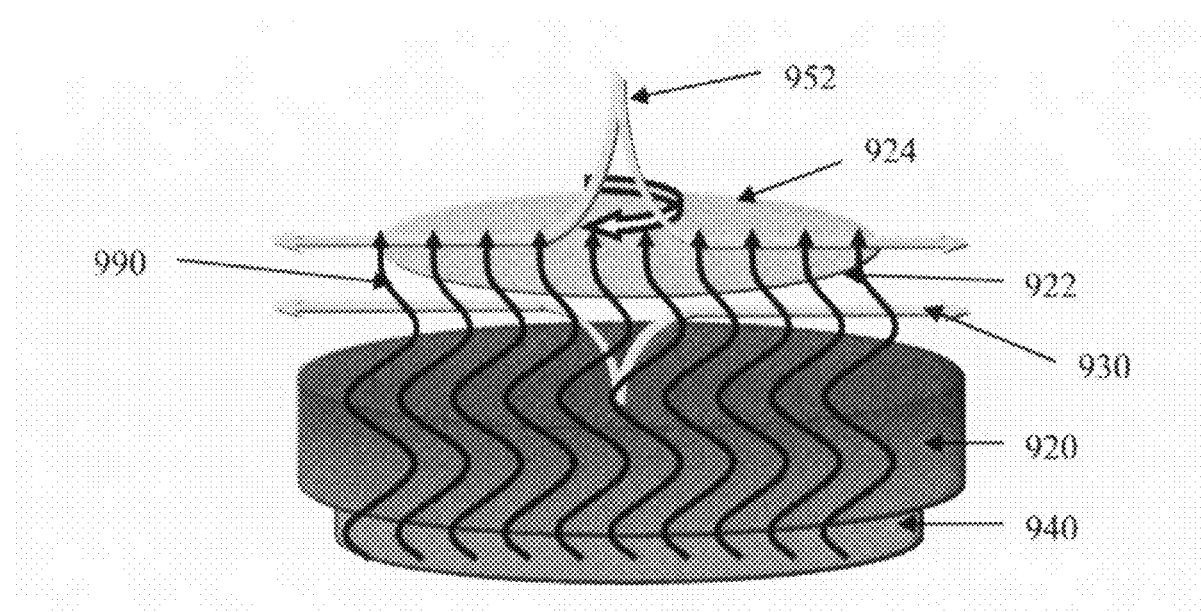
FIG. 9 is an illustration of an isometric view of an embodiment where megasonic energy is indirectly provided to the degasified liquid utilizing a platter and transducer.

FIG. 9-FIG. 12 illustrate several embodiments in which megasonic energy is provided, directly or indirectly, to the degasified liquid. FIG. 9 illustrates an alternate isometric view of the apparatus in FIG. 8B in which megasonic energy 990 is indirectly provided to the degasified liquid 952 utilizing a platter 920 and transducer 940. In such an embodiment, a workpiece is placed on rotatable holding bracket (not shown) such that the workpiece device side surface 924 is facing up and the workpiece non-device side (backside) 922 is facing down. A first cleaning fluid 930 is flowed to the workpiece non-device side surface 922, and a degasified liquid 952 is flowed to the workpiece device side surface 924. Transducers 940 operating at a power of approximately 500 W to 1,000 W at a frequency of 925 kHz to 1.4 MHz, and preferably 1,000 W at 925 kHz, can indirectly provide megasonic energy 990 to degasified liquid 952 via propagation through the workpiece. In one embodiment transducers 940 is a single transducer plate with a diameter approximately the size of the platter 120 sized for a 300 mm wafer. In such an embodiment, transducer plate 140 generates a power density of approximately 1.4 W/cm$^2$.

Figure 10:
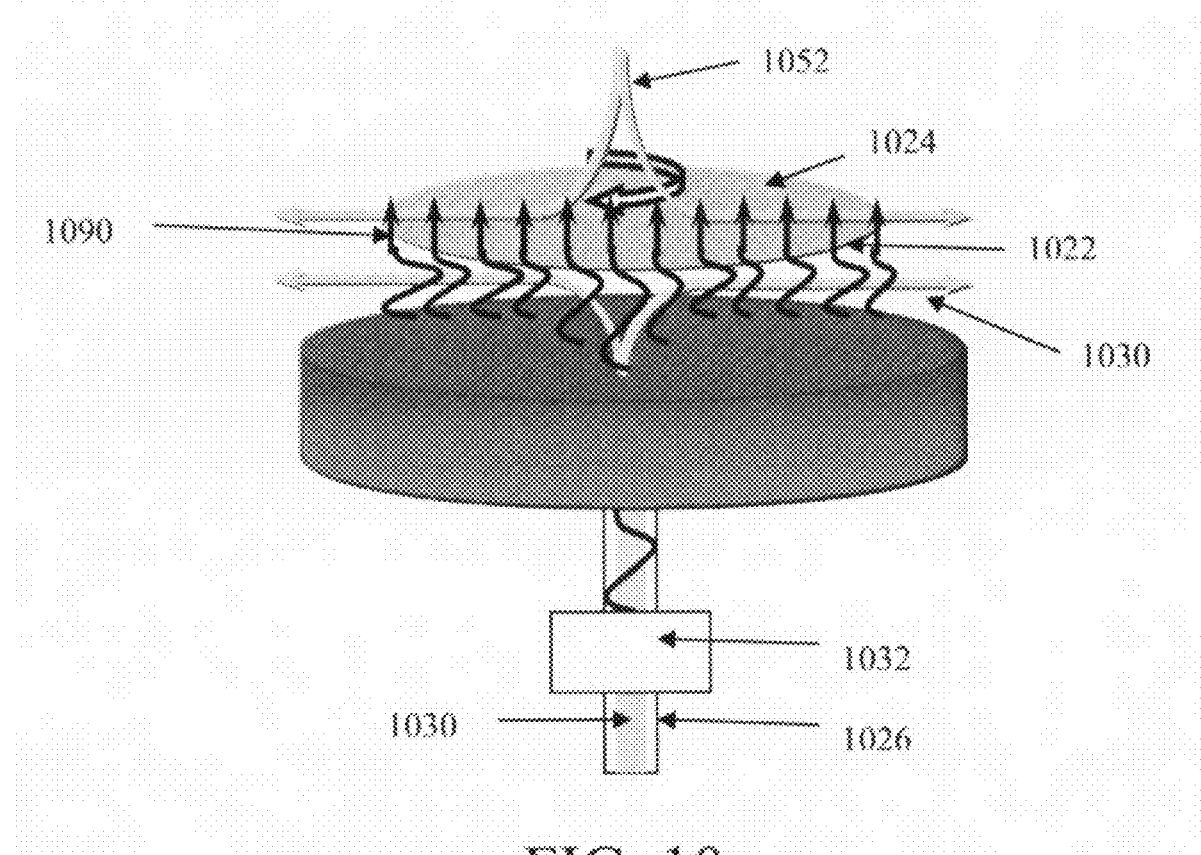
FIG. 10 is an illustration of an isometric view of an embodiment where megasonic energy is indirectly provided to the degasified liquid utilizing a sonicated fluid.

In another embodiment, as shown in FIG. 10, megasonic energy 1090 is provided to the degasified liquid 1052 utilizing a sonicated fluid 1030. In such an embodiment, a workpiece is placed on rotatable holding bracket (not shown) such that the workpiece device side surface 1024 is facing up and the workpiece non-device side (backside) 1022 is facing down. A first cleaning fluid 1030 flows through tube 1026 and through sonicating unit 1032. Cleaning fluid 1030 exits sonicating unit 1032 and flows to the workpiece non-device side surface 1022. Degasified liquid 1052 is flowed through a nozzle (not shown) to the device side surface 1024. Megasonic energy 1090 is indirectly provided to degasified liquid 1052 via propagation through the workpiece.

Figure 11:
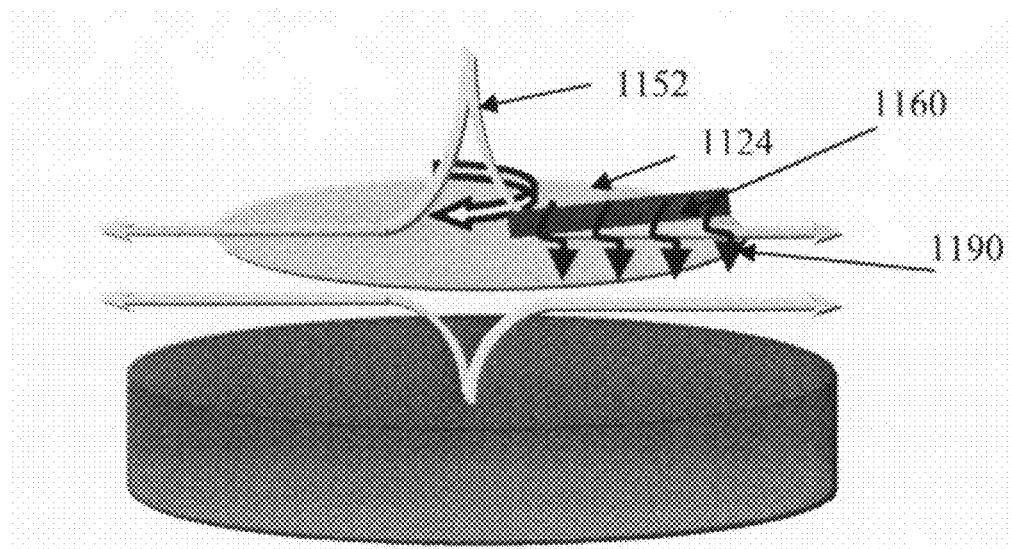
FIG. 11 is an illustration of an isometric view of an embodiment where megasonic energy is directly provided to the degasified liquid utilizing a megasonic bar.

In yet another embodiment, as shown in FIG. 11, megasonic energy 1190 is directly provided to the degasified liquid 1152 by operating a megasonic bar 1160 above and adjacent to workpiece device side surface 1124. In such an embodiment megasonic bar 1160 is close enough to the workpiece surface 1124 such that it touches the film of degasified liquid 1152 on the device side surface 1124. In one embodiment the gap between the workpiece surface 1124 and megasonic bar 1160 is in the range of approximately 1-5 mm and preferably approximately 3 mm, and the degasified liquid 1152 film thickness is greater than 3 mm. In such an embodiment, the degasified liquid 1152 may directly transfer the sound pressure waves from the megasonic bar 1160 to the workpiece device side surface 1124. In one embodiment, megasonic bar 1160 generates a power density of approximately 1.4 W/cm$^2$.

Figure 12:
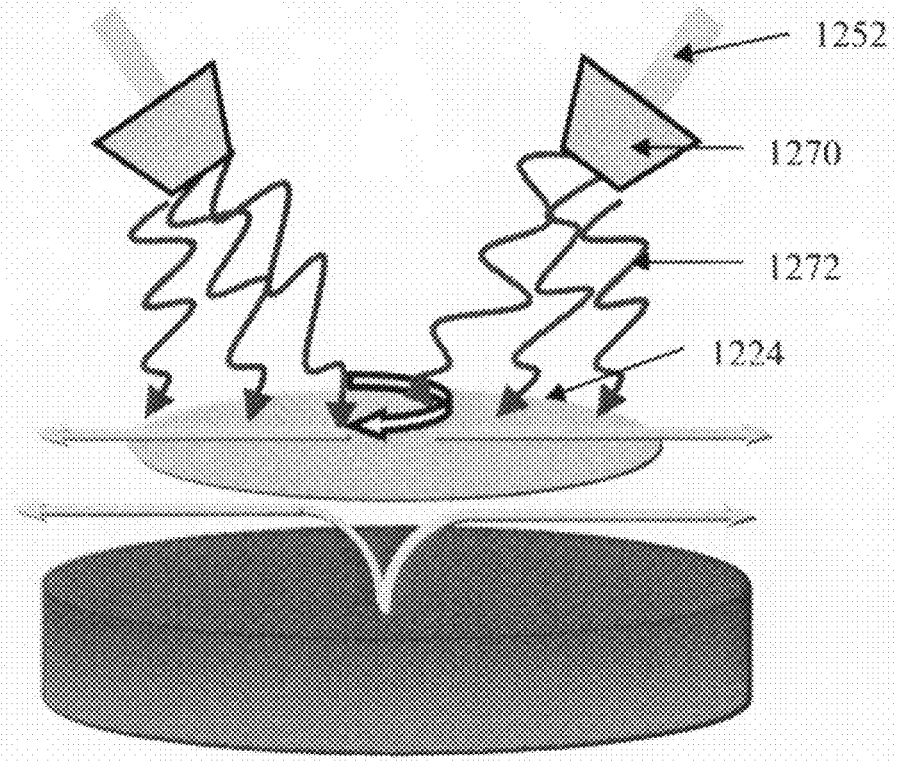
FIG. 12 is an illustration of an isometric of an embodiment where megasonic energy is directly provided to the degasified liquid utilizing at least one megasonic spray nozzle.

In another embodiment, as shown in FIG. 12, megasonic energy is directly provided to the degasified liquid 1252 by flowing degasified liquid 1252 through at least one megasonic spray nozzle 1270. The megasonic spray nozzle 1270 sonicates the degasified liquid 1252, and transmits the sonicated degasified liquid spray 1272 directly to the device side surface 1224. It is appreciated that the embodiments disclosed in FIG. 11 and FIG. 12 are also compatible with other embodiments, such as those disclosed in FIG. 9 and FIG. 10, so that megasonic energy can be directly provided to both sides of the workpiece.

Although the present invention has been described in language specific to structural features and/or methodoligical acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A process for cleaning a workpiece comprising:
   placing a workpiece on a rotatable holding bracket within a process chamber, the workpiece having a device side surface and non-device side surface;
   flowing a first fluid between the workpiece non-device side surface and a top surface of a platter aligned beneath and parallel to the workpiece to form a puddle on the top surface of the platter;

contacting a meniscus of the puddle with the workpiece non-device side surface while rotating the workpiece so that the puddle is smeared by the rotating workpiece and remains centered on the platter;

flowing a degasified liquid from a fluid outlet located above the workpiece to the workpiece device side surface; and providing acoustic energy to the degasified liquid.

2. The process of claim 1, wherein providing acoustic energy to the degasified liquid comprises transferring megasonic energy directly to the first fluid, then to the workpiece non-device surface, through the workpiece, and to the degasified liquid on the workpiece device side surface.

3. The process of claim 1, further comprising degasifying a liquid to contain less than approximately 30 ppb O2 before flowing the degasified liquid to the workpiece device side surface.

4. The process of claim 1, further comprising degasifying a liquid to contain less than approximately a total 30 ppb of O2, N2, and CO2 before flowing the degasified liquid to the workpiece device side surface.

5. The process of claim 1, wherein providing acoustic energy to the degasified liquid comprises operating a megasonic bar above and adjacent to the workpiece device side surface.

6. The process of claim 1, wherein providing acoustic energy to the degasified liquid comprises flowing the degasified liquid through a megazonic spray nozzle.

7. The process of claim 1, further comprising transferring the workpiece to a lithography tool and exposing the workpiece to UV light.

8. The process of claim 2, wherein transferring megasonic energy directly to the first fluid comprises operating a transducer, attached to the platter located beneath and parallel to the workpiece, at a single frequency in the range of 925 kHz to 1.4 MHz.

9. A process for cleaning a workpiece comprising:

placing a workpiece on a rotatable holding bracket within a process chamber, the workpiece having a device side surface and non-device side surface;

flowing a first fluid between the workpiece non-device side surface and a top surface of a platter aligned beneath and parallel to the workpiece at a first flow rate to form a puddle on the top surface of the platter;

contacting a meniscus of the puddle with the workpiece non-device side surface while rotating the workpiece at a first RPM so that the puddle is smeared by the rotating workpiece and remains centered on the platter;

increasing the first fluid flow to a second flow rate greater than the first flow rate after smearing the puddle;

flowing a degasified liquid on the workpiece device side surface while flowing the first fluid flow at the second flow rate:

increasing the workpiece rotation to a second RPM; and providing megasonic energy to the workpiece non-device side surface while rotating the workpiece at the second RPM.

10. The method of claim 9, further comprising raising the platter to a cleaning position while forming the puddle on the top surface of the platter.

11. The method of claim 9, further comprising raising the platter to a cleaning position prior to contacting the meniscus of the puddle with the workpiece non-device side surface.

12. The process of claim 9, wherein the degasified liquid has an O2 concentration less than approximately 30 ppb.

13. The process of claim 9, wherein the degasified liquid has a total O2, N2, and CO2 gas concentration less than approximately 30 ppb.

14. The method of claim 10, wherein providing megasonic energy to the workpiece non-device side surface further comprises turning on at least one acoustic wave transducer, attached to a bottom surface of the platter.

15. The process of claim 11, wherein the top surface of the platter at the cleaning position is between approximately 1-5 mm apart from the workpiece non-device side surface.

* * * * *